United States Patent
Hayashi et al.

(10) Patent No.: US 7,923,723 B2
(45) Date of Patent: Apr. 12, 2011

(54) THIN-FILM TRANSISTOR AND DISPLAY DEVICE USING OXIDE SEMICONDUCTOR

(75) Inventors: Ryo Hayashi, Yokohama (JP); Katsumi Abe, Kawasaki (JP); Masafumi Sano, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1 day.

(21) Appl. No.: 12/281,783

(22) PCT Filed: Feb. 23, 2007

(86) PCT No.: PCT/JP2007/053981
§ 371 (c)(1),
(2), (4) Date: Sep. 5, 2008

(87) PCT Pub. No.: WO2007/108293
PCT Pub. Date: Sep. 27, 2007

(65) Prior Publication Data
US 2009/0072232 A1 Mar. 19, 2009

(30) Foreign Application Priority Data
Mar. 17, 2006 (JP) .................. 2006-074627

(51) Int. Cl.
*H01L 29/786* (2006.01)
*H01L 31/0376* (2006.01)
*H01L 29/04* (2006.01)

(52) U.S. Cl. ....... 257/43; 257/57; 257/72; 257/E29.296; 257/E29.006

(58) Field of Classification Search ............ 257/43, 257/57, 59, 72, 197, 83, 89, 635, 347, 351–354, 257/E21.32, E29.006, E29.296
See application file for complete search history.

(56) References Cited

U.S. PATENT DOCUMENTS

| | | | |
|---|---|---|---|
| 5,773,325 A | 6/1998 | Teramoto | 438/151 |
| 6,087,229 A | 7/2000 | Aronowitz et al. | 438/287 |
| 6,132,817 A | 10/2000 | Tokutake et al. | 427/578 |
| 6,563,174 B2 | 5/2003 | Kawasaki et al. | |
| 7,411,209 B2 | 8/2008 | Endo et al. | 257/43 |

(Continued)

FOREIGN PATENT DOCUMENTS

JP  2002-076356 A  3/2002

(Continued)

OTHER PUBLICATIONS

K. Nomura et al., "Room-temperature fabrication of transparent flexible thin-film transistors using amorphous oxide semiconductors", Nature, vol. 432, Nov. 25, 2004, pp. 488-492.

(Continued)

*Primary Examiner* — Victor Mandala
*Assistant Examiner* — Whitney Moore
(74) *Attorney, Agent, or Firm* — Fitzpatrick, Cella, Harper & Scinto (57) ABSTRACT

The thin-film transistor of the present invention has at least a semiconductor layer including: on a substrate, a source electrode, a drain electrode, and a channel region; a gate insulating film; and a gate electrode, wherein the semiconductor layer is an oxide semiconductor layer, and wherein the gate insulating film is amorphous silicon including at least O and N, and the gate insulating film has a distribution of an oxygen concentration in a thickness direction so that the oxygen concentration is high in the side of an interface with an oxide semiconductor layer and the oxygen concentration decreases toward the side of the gate electrode.

21 Claims, 4 Drawing Sheets

U.S. PATENT DOCUMENTS

| | | | |
|---|---|---|---|
| 2001/0041250 A1 | 11/2001 | Werkhoven et al. | 428/212 |
| 2003/0218221 A1 | 11/2003 | Wager, III et al. | 257/410 |
| 2005/0127380 A1 | 6/2005 | Kawasaki et al. | 257/84 |
| 2005/0199959 A1 | 9/2005 | Chiang et al. | 257/368 |
| 2006/0113536 A1* | 6/2006 | Kumomi et al. | 257/57 |
| 2006/0175609 A1* | 8/2006 | Chan et al. | 257/59 |
| 2007/0194379 A1* | 8/2007 | Hosono et al. | 257/347 |

FOREIGN PATENT DOCUMENTS

JP   2003-086808 A   3/2003

OTHER PUBLICATIONS

Nkkei MicroDevices, Feb. 2006, Table 2 on p. 74 (with English translation thereof attached).

\* cited by examiner

THIN-FILM TRANSISTOR AND DISPLAY DEVICE USING OXIDE SEMICONDUCTOR

TECHNICAL FIELD

The present invention relates to a thin-film transistor including amorphous silicon containing at least O and N as a gate insulating film; and a display device using the transistor.

BACKGROUND ART

Recently, as Japanese Patent Application Laid-Open No. 2002-076356 also discloses, developments of thin-film transistors (TFTs) each using a polycrystalline thin film of a transparent conductive oxide including ZnO as a main component for a channel layer have been actively performed.

Since the above-mentioned thin film can be formed as a film at a low temperature and is transparent to visible light, and it is made possible to form a flexible transparent TFT on a substrates such as a plastic plate or a film.

Furthermore, Japanese Patent Application Laid-Open No. 2003-086808 discloses that an insulating layer is formed into two-layer structure in a thin-film transistor which has a transparent semiconductor using ZnO or the like. Here, it is said that it is possible to aim to enhance crystallinity in a semiconductor layer and to reduce a defective level of an interface between a semiconductor and an insulating film by using an oxide (e.g., $SiO_2$) on a semiconductor interface side, and using highly insulating $SiN_X$ or the like on a gate electrode side.

In addition, a technique of using for a channel layer of a TFT a transparent amorphous oxide semiconductor film (a-IGZO) which is made of indium, gallium, zinc, and oxygen is disclosed in Nature, 488, 432, (2004). Further, it is shown that it is possible to form a flexible and transparent TFT, which shows good field effect mobility of 6 to 9 $cm^2V^{-1}s^{-1}$, on a substrate such as a polyethylene terephthalate (PET) film in room temperature.

Furthermore, in Table 2 of Page 74 of Nikkei Micro Device, February 2006, there is description of using SiON for an insulating layer of a thin-film transistor which uses a-IGZO for a channel layer of a TFT.

Since oxygen defects can be generated easily and many carrier electrons are generated in a conductive transparent oxide containing ZnO as a main component, it is difficult to make electric conductivity small.

On the other hand, generally, amorphous silicon nitride ($SiN_x$) formed by a PFCVD method is used as a gate insulating film of an amorphous silicon TFT. However, when $SiN_x$ is used as a gate insulating film in a TFT in which a conductive transparent oxide containing ZnO as a main component is used as an active layer, a large current flows between a source terminal and a drain terminal also at the time of not applying a gate voltage. In consequence, it becomes difficult to enlarge an on/off ratio of a transistor. As its main cause, as described also in Japanese Patent Application Laid-Open No. 2002-076356, it is cited that ZnO crystallinity near the interface decreases because oxygen is taken from an oxide semiconductor in an interface between a conductive transparent oxide channel layer and the gate insulating film.

In addition, as matters other than the crystallinity decrease, when using for a channel layer of a TFT the transparent amorphous oxide semiconductor film (a-IGZO) which is made of indium, gallium, zinc, and oxygen as disclosed in Nature, 488, 432, (2004), the following problems exist. That is, there is a case of generating the increase of the electric conductivity which is considered to be based on generation of defects in the interface between the conductive transparent oxide channel layer and gate insulating film. Also in this case, even at the time of not applying the gate voltage, a large current flows between the source terminal and drain terminal, and hence, it is difficult to achieve a normally-off operation of a TFT. Furthermore, it is not necessarily easy to enlarge the on/off ratio of a transistor.

Moreover, when an insulating layer has a two-layer structure of using an oxide (e.g., $SiO_2$) on a semiconductor interface side and highly insulating $SiN_x$ or the like on a gate electrode side as disclosed in Japanese Patent Application Laid-Open No. 2002-076356, there were the following problems. That is, there were problems that hysteresis of TFT characteristics was expanded and reproducibility of TFT characteristics was poor since an interface was constructed in the insulating layer to generate defects. In addition, when a TFT was formed on a film at a low temperature and a bending test was performed, degradation of the TFT characteristics was found which was considered to be caused by interface defects generated in the insulating layer having the two-layer structure.

Furthermore, when insulating films with a high dielectric constant, which are made of oxides such as $Al_2O_3$, $Y_2O_3$, and $HfO_2$, are formed at a low temperature of 300° C. or less, or room temperature, these insulating films with a high dielectric constant become polycrystalline substances. Then, it is usually difficult to make crystal orientation and polycrystal grain size uniform, and to improve stability and reliability. In addition, since a portion where grain size changes exists in a thickness direction at an early stage its polycrystalline structure is easy to become ununiform. Since an insulating film surface had surface morphology according to the grain size, there was a problem that an interface between a channel layer and a gate insulating film, or an interface between the gate insulating film and a gate electrode metal did not become flat.

Then, an object of the present invention is to provide a thin-film transistor having a good interface between an oxide semiconductor and an insulating layer.

DISCLOSURE OF THE INVENTION

In consequence of having advanced energetically research and developments with regard to a TFT using a transparent oxide semiconductor, the present inventors obtained the following finding which could solve the above-described problems by employing the following structure. Thus, it is the structure of using as the above-described gate insulating film an insulating film which is composed of amorphous silicon containing at least O and N, and has a distribution of oxygen concentration in a thickness direction so that the oxygen concentration is high in a side of an interface with an oxide semiconductor layer and the oxygen concentration decreases toward a gate electrode. By using such an insulating film, it is possible to produce stably a thin film TFT with good interface characteristics.

The present invention will be specifically described below.

A thin-film transistor of the present invention is a thin-film transistor includes: on a substrate, at least a semiconductor layer including a source electrode, a drain electrode, and a channel region; a gate insulating layer; and a gate electrode, wherein the above-described semiconductor layer is an oxide semiconductor layer, and wherein the above-described gate insulating film is composed of amorphous silicon containing at least O and N, and the above-described gate insulating film has a distribution of oxygen concentration in a thickness direction so that the oxygen concentration is high in a side of an interface with an oxide semiconductor layer and the oxygen concentration decreases toward a side of the gate electrode.

BEST MODE FOR CARRYING OUT THE INVENTION

In a thin-film transistor (TFT) of this embodiment, amorphous silicon containing at least O and N (a-SiO$_x$N$_y$: hereinafter, also referred to as "amorphous silicon oxynitride") is used as a gate insulating film material.

It is preferable to use ZnO, or an oxide semiconductor including In, Zn, and O for a channel layer of the thin-film transistor. Then, it is preferable to use as the channel layer an amorphous oxide including In, Zn and O, and further at least one kind selected from the group consisting of Ga, Al, Fe, Sn, Mg, Ca, Si, and Ge, and having a resistance value less than $10^{10}$ Ω·cm. When the resistance value of the channel layer becomes larger than $10^{10}$ Ω·cm, it is difficult that it functions as a TFT. More preferably, it is $10^3$ or more Ω·cm and less than $10^9$ Ω·cm. It is possible to obtain a high value of over 1 cm$^2$/(V·sec) of field effect mobility and to set an on/off ratio to be more than $10^3$ by using a resistance value in this range as an amorphous oxide semiconductor layer.

Figure 1:
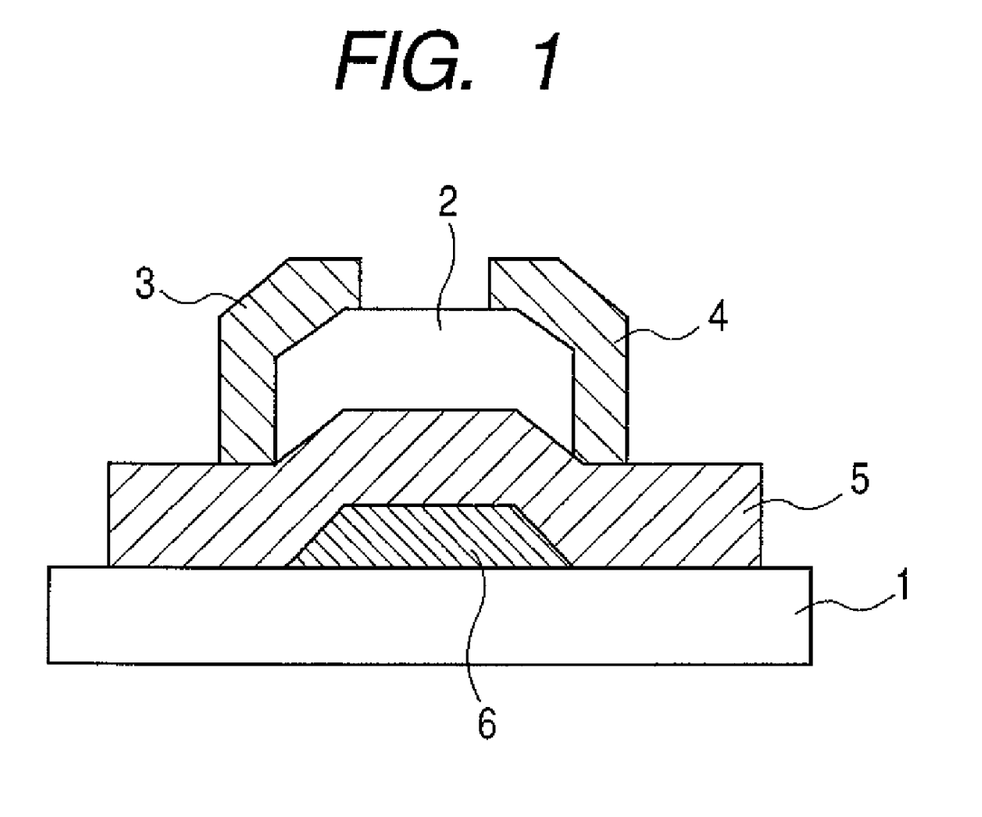
FIG. 1 is a structural view of an inversed staggered TFT in which an amorphous silicon oxynitride is used for a gate insulating film.

As an example of a thin-film transistor according to this embodiment, the constitution of a thin-film transistor with a bottom gate structure is shown in FIG. 1. This is constructed by providing a gate electrode 6 on a substrate 1, and further providing a gate insulating film 5 thereon, and furthermore providing a channel layer 2 made of an oxide semiconductor, a source electrode 3, and a drain electrode 4 thereon.

It is possible to produce a-SiO$_x$N$_y$ of the gate insulating film 5 at a relatively low temperature of 350° C. or less by a PECVD (plasma CVD) method, and to use a glass substrate as the substrate 1.

In addition, since it is possible to produce the channel layer 2 at room temperature when using an amorphous oxide containing In, Zn and O for the channel layer 2, it is possible to form all the film formation stages at room temperature when a sputtering method is used also for the insulating film. Furthermore, it is possible to use further a plastic plate, a plastic film, or the like as the substrate.

(Regarding Gate Insulating Film)

When adopting the structure of FIG. 1, forming an a-IGZO thin film by using a sputtering method which can perform large area film formation to use it for the channel layer, and using an amorphous silicon nitride (SiN$_x$) by the PECVD method for the gate insulating layer, the following problem may arise. Thus, there may be in a state that, even when a negative voltage is applied to a gate electrode, a large current flows between a source terminal and a drain terminal, and hence, a TFT does not operate (Id does not turn off).

The a-SiO$_x$N$_y$ of the gate insulating film according to this embodiment is set to have a high oxygen concentration in the side of an interface with the oxide semiconductor such that oxygen is not taken from it by the oxide semiconductor.

Figure 3:
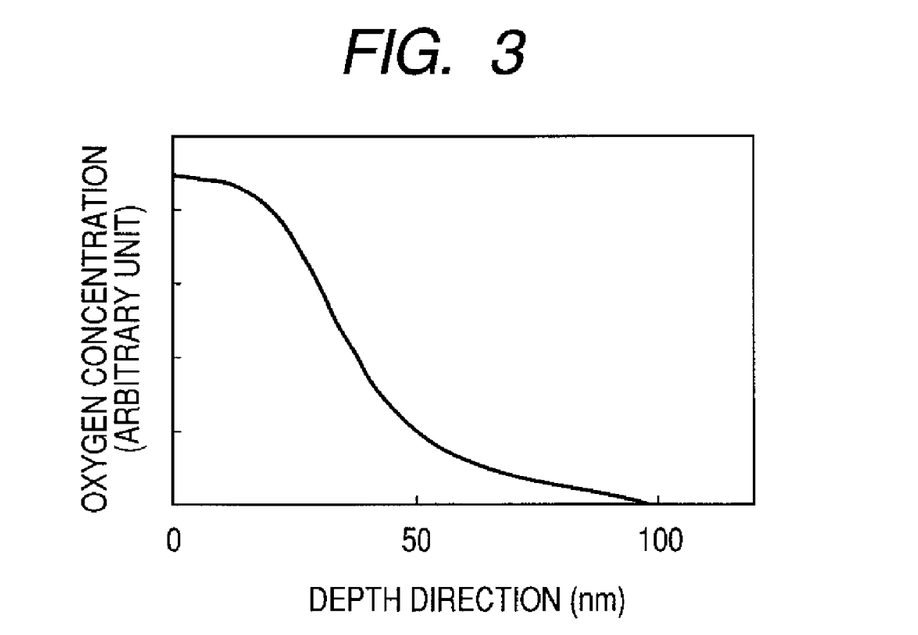
FIG. 3 is a graph showing an oxygen concentration distribution in an amorphous silicon oxynitride insulating film.
Figure 5:
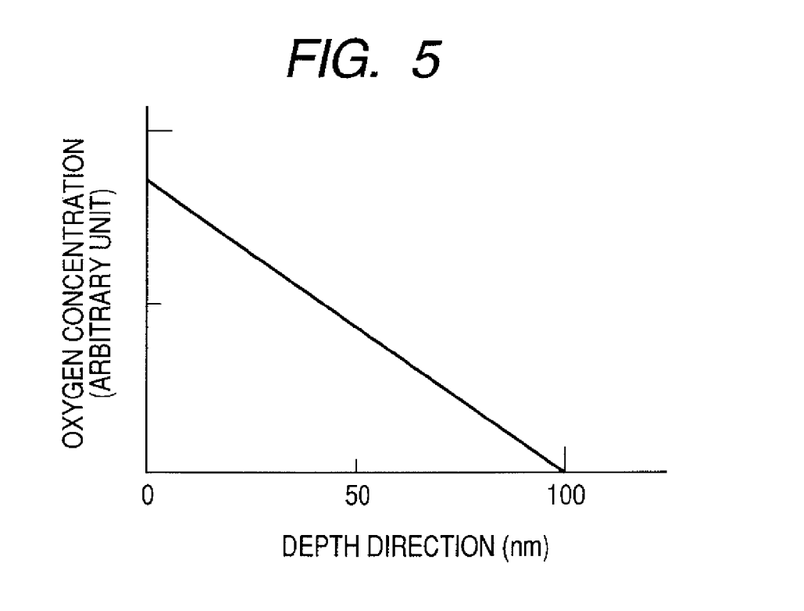
FIG. 5 is a graph showing another oxygen concentration distribution in an amorphous silicon oxynitride insulating film.

Further, as a synthetic standard of value of a gate insulating film, it is also required to have a high withstand voltage and a high dielectric constant. Then, it is desirable to distribute an oxygen concentration higher in the side of an interface with the oxide semiconductor than in the side of a gate electrode, rather than making the oxygen concentration in the gate insulating film uniform. Then, the oxygen concentration is made to decrease toward the side of the gate electrode. Thereby, it is possible to take in advantages of the amorphous silicon nitride (a-SiN$_x$) from which oxygen is hardly taken through the interface with the oxide semiconductor and which has larger value dielectric constant and withstand voltage than those of a-SiO$_2$. As the distribution of the oxygen concentration, it is possible to use, for example, one of distributions shown in FIGS. 3 and 5. FIGS. 3 and 5 are graphs showing oxygen concentration distributions in the amorphous silicon oxynitride insulating film. A horizontal axis of these figures shows the depth (height) from the interface with the oxide semiconductor, and a vertical axis of these figures shows the oxygen concentration (arbitrary unit; logarithmic value).

In addition, according to this embodiment, since the insulating layer is constructed of one layer, it is possible to suppress defective generation in the insulating layer to the minimum. In addition, since there is no interface in the insulating layer, it is possible to suppress characteristic degradation of the TFT at the time of performing a bending test of the TFT formed on a film at a low temperature. Consequently, when the insulating layer is formed at 300° C. or less, especially at a low temperature of 200° C. or less, or at room temperature, it becomes possible to make hysteresis due to defect density in the insulating layer small in comparison with, for example, an insulating layer with stacked structure of a-SiO$_2$ which is an oxide insulating layer and a-SiN$_x$. Hence, it is possible to improve also reproducibility and stability of TFT characteristics.

As for the oxygen concentration distribution of a-SiO$_x$N$_y$, it is possible to increase an oxygen concentration in the side of the interface with the oxide semiconductor by changing the flow rate ratio of raw material gases, which is a production condition of a PECVD. In addition, it is possible to distribute an oxygen concentration in the insulating film by changing the oxygen concentration of a sputtering gas by a sputtering method. Furthermore, it is possible to distribute an oxygen concentration in the insulating film by performing oxidation after forming a-SiO$_x$N$_y$ or a-SiN$_x$ with a constant oxygen concentration as a film. Since the insulating layer obtained in this way has an amorphous structure, its surface property becomes very flat. The gate insulating film inherits surface flatness of a base, and the insulating layer in the inversed staggered structure shown in FIG. 1 maintains the flatness of the substrate.

Figure 2:
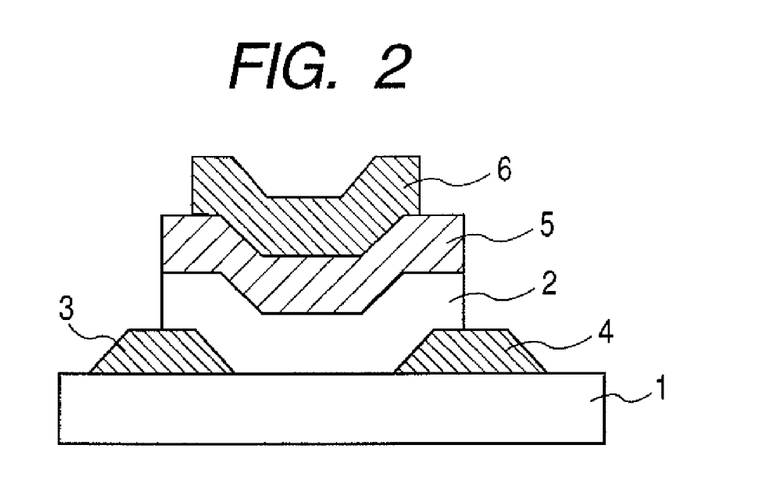
FIG. 2 is a structural view of a staggered TFT in which an amorphous silicon oxynitride is used for a gate insulating film.

An effect of using the amorphous silicon oxynitride as a gate insulating film material is effective also in both structure of a bottom gate and a top gate. Staggered structure is shown in FIG. 2 as an example of the top gate structure. The insulating layer maintains the flatness also on the channel layer 2 flatly formed in the staggered structure. Thus, an interface between the gate insulating film 5 and channel layer (semiconductor layer) 2 can keep its relative area at a minimum, and can suppress the defective number of the interface. In addition, there is not a grain boundary as in polycrystalline structure because of amorphous structure. Generally a defect tends to be generated in a grain boundary and it is easy to become a carrier trap. In addition, although a grain boundary in a gate insulating film easily becomes an origin of a gate leakage current, it makes also possible to suppress it by using an insulating layer with an amorphous structure. According to these effects, it is possible to suppress the problems of decreasing an electron mobility and having hysteresis in transistor characteristics.

In addition, a small content of carbon or halogen as impurity in the amorphous silicon oxynitride which was the gate insulating film did not greatly influence TFT characteristics and stability.

(Regarding Oxide Semiconductor)

When a transparent conductive oxide semiconductor polycrystalline thin film containing ZnO formed at 300° C. or lower as a main component, or a transparent conductive oxide semiconductor thin film containing ZnO including microcrystals as a main component is stacked on an $SiN_x$ insulating film by a PFCVD method, the following matter may arise. That is, there is a case of showing an electric conductivity larger in one to three orders in comparison with a case of depositing on thermally oxidized $SiO_2$, and in this case, it is difficult to decrease an off-state current of a TFT. The above-mentioned transparent conductive oxide semiconductor polycrystalline thin film or a transparent conductive oxide semiconductor thin film was stacked on the amorphous silicon oxynitride (a-$SiO_xN_y$) insulating film in this embodiment. In consequence, an electric conductivity equal to that as in the case that deposition was performed on the thermally oxidixed $SiO_2$ was obtained.

As described above, an oxide semiconductor TFT using the a-$SiO_xN_y$ insulating film of this embodiment suppresses occurrence of an oxygen defect in an interface between a semiconductor layer and an insulating layer, and has an effect of decreasing an off-state current of the TFT.

In addition, the structure of using a transparent amorphous oxide semiconductor film (a-IGZO) composed of indium, gallium, zinc, and oxygen for a channel layer of a TFT is disclosed by Nature, 488, 432, (2004). And, it discloses that it is possible to form a flexible and transparent TFT which shows a good field effect mobility of 6 to 9 $cm^2V^{-1}s^{-1}$ on a substrate such as a polyethylene terephthalate (PET) film at room temperature. For example, an amorphous oxide semiconductor layer (a-IGZO thin film) having a composition ratio of indium, gallium, and zinc being 1:1:1 for a thin-film transistor is formed by using a sputtering method which can form a large area film. Then, by applying this amorphous oxide semiconductor layer to the thin-film transistor using the amorphous silicon nitride (a-$SiN_x$) insulating layer of this embodiment, the structure as shown in FIG. 1 is formed. Thereby, it becomes also possible to increase an on/off ratio of a transistor to $10^5$ or more. At that time, the field effect mobility shows 7 $cm^2V^-S^{-1}$ or more, and it has a suppressing effect also in occurrence of hysteresis in transistor characteristics.

According to this embodiment, because of these effects, it is possible to provide a thin-film transistor having a good interface between an oxide semiconductor and an insulating layer by using an amorphous silicon oxynitride as the insulating layer in the thin-film transistor using an oxide semiconductor. In addition, by the amorphous silicon oxynitride insulating layer having a distribution in a thickness direction in which an oxygen concentration is higher in the side of an interface with an oxide semiconductor, it becomes possible to provide a thin-film transistor which is more stable and uniform.

In the above-mentioned explanation, the example using a transparent conductive oxide semiconductor polycrystalline thin film containing ZnO as a main component for a semiconductor layer (channel layer), or a transparent conductive oxide semiconductor thin film containing ZnO including microcrystals as a main component is explained. Furthermore, although the example using an amorphous oxide composed of In, Ga, Zn and O is explained, the oxide semiconductor layer is not limited to these.

As the amorphous oxide semiconductor layer including In, Ga, Zn and O, it, is possible to use an amorphous oxide including at least one kind of element among Sn, In and Zn.

Furthermore, when Sn is selected in at least a part of, the constituent elements of the amorphous oxide, it is also possible to replace Sn with $Sn_{1-x}M4_x$ (0<x<1, and M4 is selected from Si, Ge, or Zr which are Group 4 elements having atomic numbers smaller than that of Sn).

Moreover, when In is selected as at least a part of the constituent elements of the amorphous oxide, it is also possible to replace In with $In_{1-y}M3_y$ (0<y<1, and M3 is selected from Lu, or B, Al, Ga or Y which are Group 3 elements having atomic numbers smaller than that of In).

In addition, when Zn is selected as at least a part of the constituent elements of the amorphous oxide, it is also possible to replace Zn with $Zn_{1-z}M2_z$ (0<z<1, and M2 is selected from Mg or Ca which are Group 2 elements having atomic numbers smaller than that of Zn).

Specifically, amorphous materials applicable to this embodiment are an Sn—In—Zn oxide, an In—Zn—Ga—Mg oxide, an In oxide, an In—Sn oxide, an In—Ga oxide, an In—Zn oxide, a Zn—Ga oxide, an Sn—In—Zn oxide, etc. Of course, it is not necessary that a composition ratio of the constituent materials is always 1:1. In addition, although there is a case where it is difficult to form Zn or Sn alone into an amorphous phase, it becomes easy to form an amorphous phase by addition of In thereto. For example, in the case of an In—Zn system, it is good to make a composition that, regarding an atomic number ratio except oxygen, In is contained by about 20 atomic % or more. In the case of an Sn—In system, it is good to make a composition that, regarding an atomic number ratio except oxygen, In is contained by about 80 atomic % or more. In the case of an Sn—In—Zn system, it is good to make a composition that, regarding an atomic number ratio except oxygen, In is contained by about 15 atomic % or more.

In addition, it is possible to confirm an amorphous phase by detecting no clear diffraction peak (that is, by observing a halo pattern) when X-ray diffraction at a low incident angle having about 0.5° of incident angle is performed to a thin film to be measured. In addition, in this embodiment, when using the above-mentioned material for a channel layer of a field-effect transistor, it is not excepted that the channel layer includes a constituent material in a microcrystalline state.

Next, it is possible to construct a display device by connecting an electrode of a display element, such as an organic or inorganic electroluminescence (EL) element or a liquid crystal element, to a drain which is an output terminal of the above-mentioned thin-film transistor. An example of a specific display device structure will be explained using a sectional view of a display device below.

Figure 6:
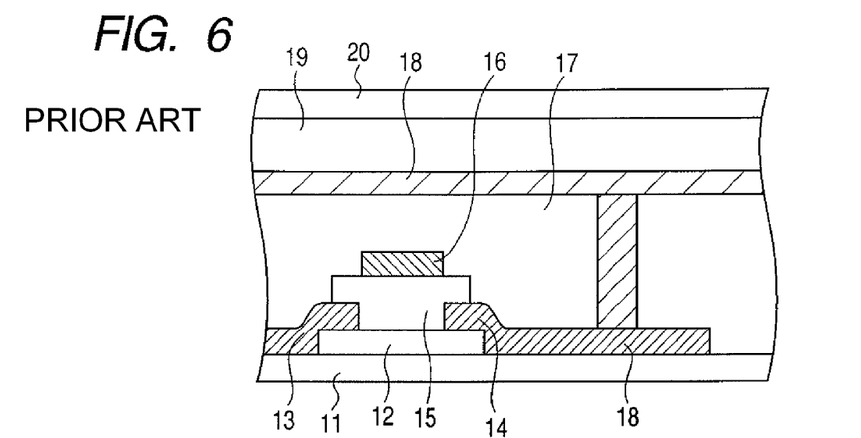
FIG. 6 is a sectional view of an example of a display device according to the present invention.

For example, as shown in FIG. 6, a TFT constructed of the above-mentioned amorphous oxide semiconductor film 12, a source electrode 13, a drain electrode 14, a gate insulating layer 15, and a gate electrode 16 is formed on a substrate 11. Then, an electrode 18 is connected to the drain electrode 14 through an interlayer insulating film 17, the electrode 18 contacts a light-emitting layer 19, and the light-emitting layer 19 further contact to an electrode 20. This structure enables a current value, which flows into the drain electrode 14 from the source electrode 13 through a channel formed by the amorphous oxide semiconductor film 12, to control a current injected into the light-emitting layer 19. Hence, it is possible to control this by a voltage of the gate 6 of the TFT. Here, the electrode 18, light-emitting layer 19, and electrode 20 construct an inorganic or organic electroluminescent element.

Figure 7:
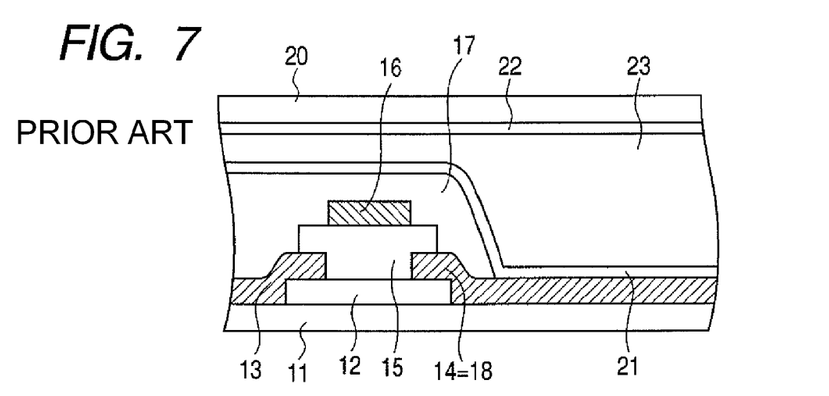
FIG. 7 is a sectional view of another example of a display device according to the present invention.

Alternatively, as shown in FIG. 7, it is possible to have a configuration that the drain electrode 14 is extended to serve also as the electrode 18, and this is used as the electrode 18 for applying a voltage to a liquid crystal cell or electrophoretic particle cell 23 which is sandwiched by high resistance films 21 and 22. The liquid crystal cell or electrophoretic particle cell 23, high resistance layers 21 and 22, electrode 18, and electrode 20 construct a display element. It becomes possible to control voltages applied to these display elements by a current value, which flows into the drain electrode 14 from the source electrode 13 through a channel formed by the amorphous oxide semiconductor film 12. Hence, it is possible to control this by a voltage of the gate 6 of the TFT. Here, if a display medium of the display element is a capsule which encapsulates fluid and particles in insulating films, the high resistance films 21 and 22 are unnecessary.

Although the top gate type coplanar structure is represented as the TFT in the above-mentioned two examples, the present invention is not necessarily limited to this structure. For example, when the connection of the drain electrode which is the output terminal of the TFT and the connection of the display element are the same in topology, other structure such as a staggered type can be also employed.

In addition, although the above-mentioned two examples show a structure that a pair of electrodes for driving a display element is provided in parallel to a substrate, this embodiment is not necessarily limited to this structure. For example, as long as the connection of the drain electrode which is the output terminal of the TFT and the connection of the display element are the same in topology, one of electrode or both electrodes may be provided orthogonally to a substrate.

Furthermore, although the above-mentioned two examples show a structure that only one TFT is connected to a display element, the present invention is not necessarily limited to this structure. For example, the TFT shown in the figures may be further connected to another TFT of the present invention as long as the TFT in the figures is a last stage of a circuit composed of the TFTS.

Here, when a pair of electrodes which drives a display element is provided in parallel to a substrate, if the display element is an EL element or a reflection type display element such as a reflective type liquid crystal element, it is necessary that any one of the electrodes is transparent to a light emission wavelength or a wavelength of reflected light. Alternatively, if it is a transmission type display element such as a transmission type liquid crystal element, it is necessary that both electrodes are transparent to transmitted light.

Furthermore, in the TFT of this embodiment, it is also possible to make all the constitutional members transparent, and thereby, it is also possible to form a transparent display element. In addition, such a display element can be provided on a low heat resistance substrate such as a lightweight, flexible, and transparent plastic plate made from a resin.

Next, a display device composed of pixels each including an EL element (here, an organic EL element) and a thin-film transistor which are arranged two-dimensionally will be explained using FIG. 8.

Figure 8:
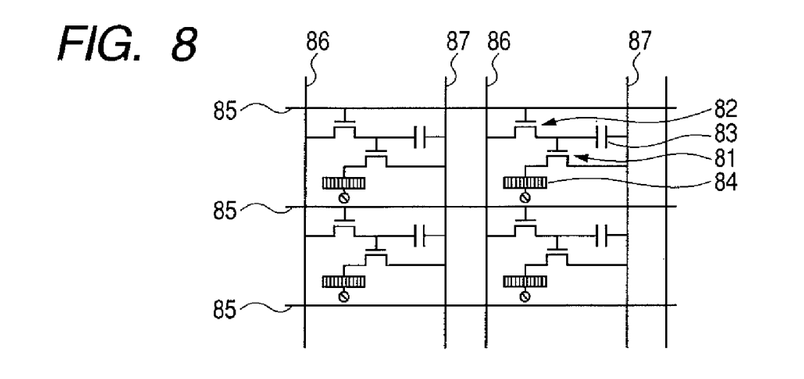
FIG. 8 is a diagram showing the structure of a display device where pixels each including an organic EL element and a thin-film transistor are arranged two-dimensionally.

In FIG. 8, reference numeral 81 denotes a transistor for driving an organic EL layer 84, and reference numeral 82 denotes a transistor for selecting a pixel. In addition, a capacitor 83 is for maintaining a state of being selected, and stores electric charges between a common electrode line 87 and a source portion of the transistor 82 to maintain a signal of a gate of a transistor 81. Pixel selection is determined by a scanning electrode line 85 and a signal electrode line 86.

With explaining more specifically, an image signal is applied as a pulse signal from a driver circuit (not shown) through a scanning electrode 85 to a gate electrode. At the same time, a pulse signal is also applied from another driver circuit (not shown) through a signal electrode 86 to a transistor 82 to select a pixel. In that time, the transistor 82 is turned on and electric charges are stored in a capacitor 83 between the signal electrode line 86 and the source of the transistor 82. Thereby, the gate voltage of the transistor 81 is maintained at a desired voltage, and the transistor 81 is turned on. This state is maintained until receiving the following signal. During the turning-on state of the transistor 81, a voltage and a current are continuously supplied to the organic EL layer 84 and light emission is maintained.

Although the example shown in this FIG. 8 has the structure composed of units each having two transistors and one capacitor, further many transistors and the like are incorporated into one pixel so as to enhance performance. Substantially, it is possible to obtain an effective EL element by using an In—Ga—Zn—O based TFT of the present invention as a transistor portion, which can be formed at a low temperature and is a transparent TFT.

Hereafter, examples of the present invention will be explained with referring to the drawings.

EXAMPLE 1

Figure 4:
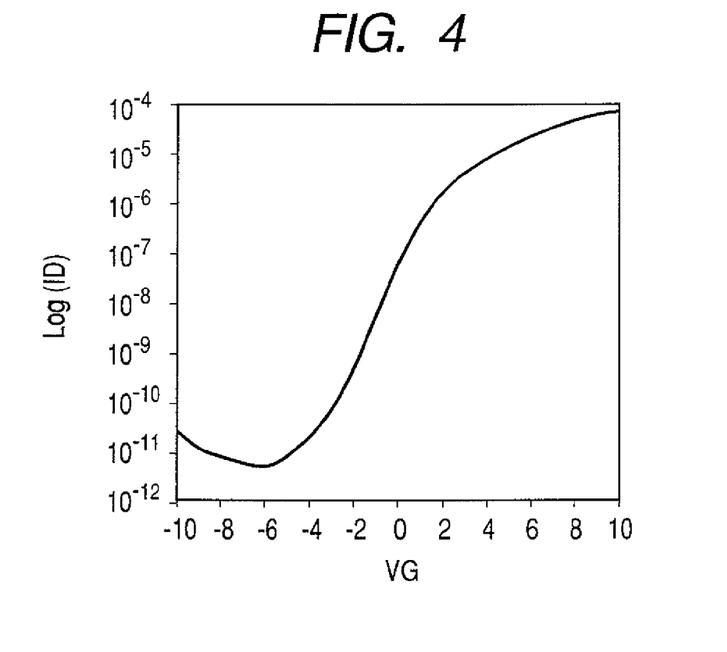
FIG. 4 is a graph showing the current-voltage characteristics of an inversed staggered (bottom gate type) MISFET element produced in the Example 1.

In this example, an inversed staggered (bottom gate type) MISFET element shown in FIG. 1 was produced so that an amorphous silicon oxynitride for forming a gate insulating film had a distribution of an oxygen concentration in a thickness direction thereof in which the oxygen concentration became high in the side of the interface with an oxide semiconductor. First of all, a gate terminal having a thickness of Ti:10 nm/Au:100 nm was formed on a glass substrate using a photolithographic method and a lift-off method. Furthermore, an insulating layer of a-SiO$_x$N$_y$ was formed in a thickness of 100 nm thereon by a sputtering method. At that time, an Si$_2$N$_3$ target was used for a sputtering target and a mixed gas of Ar/O$_2$ was used as a sputtering gas. The oxygen concentration of the mixed gas of Ar/O$_2$ was changed to give the above distribution of an oxygen concentration to the insulating layer. Then, an amorphous oxide semiconductor film to be used as a channel layer was formed in a thickness of 50 nm thereon at room temperature by a sputtering method. The structure shown in FIG. 1 was formed by using a photolithographic method and dry etching. Finally, a film having a thickness of Au:100 nm/Ti:5 nm was formed by using an electron beam vapor-deposition method, and source and drain terminals were formed by using a photolithographic method and a lift-off method. In this way, the inversed staggered (bottom gate) type MISFET element shown in FIG. 1 was completed. A metal composition ratio of the amorphous oxide semiconductor film in that case was In:Ga:Zn=1.00:0.94: 0.65. As the results of evaluating I-V characteristics of this MISFET element, field effect mobility was 7 cm$^2$/Vs, and an on/off ratio was more than $10^6$. Its transfer characteristics were shown in FIG. 4. FIG. 4 is a graph showing the characteristics of drain current (I$_D$; Amperes) vs gate voltage (Vg; Volts). Measurement of oxygen concentration in a thickness direction of the amorphous silicon oxynitride used in this example was performed. That result is shown in FIG. 3.

Up to here, the TFT using the amorphous silicon oxynitride (a-SiO$_x$N$_y$) was produced which has the distribution of an oxygen concentration in the thickness direction of an insulating layer so that the oxygen concentration of the insulating layer became high in the side of the interface with an oxide semiconductor. Then, it turned out that this TFT could suppress the off-state current at a low value and enlarge the on/off ratio of a transistor.

COMPARATIVE EXAMPLE

In Comparative Example, the inversed staggered (bottom gate) type MISFET element, as shown in FIG. 1, including amorphous silicon oxynitride (a-SiO$_x$N$_y$) with a constant oxygen concentration of an insulating layer was produced in the following manners. First of all, a 100 nm-thick Ni gate terminal was formed on a glass substrate using a photolithographic method and a lift-off method. Further, a 100 nm-thick insulating layer of a-SiO$_x$N$_y$ was formed thereon by a sputtering method using a silicon oxy-nitride target. At that time, a mixed gas of Ar/O$_2$ with a constant flow ratio was used. In addition, a PECVD method, and the like may be used as a film formation method of a-SiO$_x$N$_y$. Then, a 50 nm-thick amorphous oxide semiconductor film to be used as a channel layer was formed further thereon at room temperature by a sputtering method. Isolation of the semiconductor layer and insulating layer was performed using a photolithographic method and dry etching. Finally, a film having a thickness of Au:100 nm/Ti:5 nm was formed by an electron beam vapor-deposition method, and source and drain terminals were formed by a photolithographic method and a lift-off method. In this way, the inversed staggered (bottom gate) type MISFET element as shown in FIG. 1 was completed. A metal composition ratio of the amorphous oxide semiconductor film in that case was In:Ga:Zn=1.00:0.94:0.65. As the results of evaluating the I-V characteristics of this MISFET element, field effect mobility was 7 cm$^2$/Vs, and an on/off ratio was more than $10^5$.

The on/off ratio in Example 1 became larger by one order than that of Comparative Example, and this is because an off-state current was mainly suppressed in Example 1.

EXAMPLE 2

In this example, a staggered (top gate) type MISFET element as shown in FIG. 2 was produced. First, a film having a thickness of Ti:5-nm/Au:40-nm were stacked on a glass substrate 1, and a drain terminal 4 and a source terminal 3 were formed by a photolithographic method and a lift-off method. A 30 nm-thick amorphous In—Ga—Zn—O film having a metal composition ratio of In:Ga:Zn=1.00:0.94:0.65 which was used as a channel layer 2 was formed by a sputtering method. Furthermore, a 100 nm-thick insulating layer 5 of a-SiO$_x$N$_y$ was formed thereon by the sputtering method. At that time, an Si$_2$N$_3$ target was used for a sputtering target and a mixed gas of Ar/O$_2$ was used for a sputtering gas. The distribution of an oxygen concentration was given to an insulating layer by changing the oxygen concentration of the mixed gas of Ar/O$_2$ so that the oxygen concentration of the insulating layer became high in the side of the interface with an oxide semiconductor. Moreover, a film having a thickness of Ti:5 nm/Au:40 nm were stacked thereon, and a gate terminal 6 was formed by the photolithographic method and the lift-off method.

As the results of evaluating the I-V characteristics of this MISFET element, field effect mobility was 7 cm$^2$/Vs, and an on/off ratio was more than $10^6$.

Up to here, also the staggered (top gate) type MISFET element using the amorphous silicon oxynitride (a-SiO$_x$N$_y$) was produced which had the distribution of an oxygen concentration in the thickness direction of an insulating layer so that the oxygen concentration of the insulating layer became high in the side of the interface with an oxide semiconductor. It turned out that this TFT could suppress the off-state current at a low value and could enlarge the on/off ratio of a transistor.

EXAMPLE 3

In this example, a display device using a TFT as shown in FIG. 7 will be explained. Production process of the TFT is the same as that in Example 2. In the above-described TFT, a short side of an island of an ITO film for forming a drain electrode is extended to 100 µm, the extended 90-µm portion is left, and after securing wiring to a source electrode and a gate electrode, the TFT is covered with an insulating layer. A polyimide film is coated thereon, and the resultant is subjected to a rubbing process. On the other hand, similarly, a plastic substrate having an ITO film and a polyimide film formed thereon and subjected to a rubbing process is prepared. This substrate is made to face the above prepared substrate having the above-described TFT formed thereon with an gap of 5 µm, and a nematic liquid crystal is injected to the gap. A pair of polarizing plates is further provided on both sides of this structure. Here, when a voltage is applied to the source electrode of the TFT and the applied voltage of the gate electrode is changed, a light transmittance changes only in the region of 30 µm×90 µm which is a part of the island of the ITO film extended from the drain electrode. In addition, the transmittance is continuously also changed by a source-drain voltage at a gate voltage setting an ON state of the TFT. In this way, the display device as shown in FIG. 7 using a liquid crystal cell as a display element is produced.

In this example, a display device is also produced in which a white plastic substrate is used as a substrate for forming the TFT, each electrode of the TFT is changed to gold, the polyimide film and polarizing plate are provided, and capsules each formed by covering particles and a fluid with an insulating coating are filled in a gap between the white substrate and the transparent plastic substrate. In the case of the display device having this structure, the voltage between the drain electrode extended from this TFT and the ITO film provided at an upper position thereof is controlled, and hence, the particles in the capsule move up and down. Thereby, it is possible to perform display by controlling reflectivity of the extended drain electrode region which was seen from the transparent substrate side.

In addition, in this example, it is also possible to drive an EL element by, as the case of adjacently forming a plurality of TFTs, constructing a current control circuit having a usual structure of, for example, four transistors and one capacitor, and using the TFT as shown in FIG. 6 for one transistor at the final stage. For example, a TFT using the above-described ITO film as a drain electrode is used. Then, an organic electroluminescence element composed of a charge injection layer and a light-emitting layer is formed in the region of 30 µm×90 µm which is a part of the island of the ITO film extended from the drain electrode. In this way, it is possible to form the display device using EL elements.

EXAMPLE 4

The display elements and TFTs in Example 3 are arranged two-dimensionally. Specifically, 7425×1790 pieces of pixels, each of which occupies an area of about 30 μm×115 μm and includes a display element such as a liquid crystal cell or an EL element, and the TFT in Example 3, are arrayed rectangularly at a pitch of 40 μm in a short side direction, and at a pitch of 120 μm in a long side direction, respectively. Then, 1790 lines of gate wirings each connecting with gate electrodes of 7425 TFTs in a long side direction are provided, and 7425 lines of signal wirings each connecting with portions of source electrodes of 1790 TFTs, which are protruded by 5 μm from the islands of the amorphous oxide semiconductor films, in a short side direction are provided. Then, the gate wirings and the signal wirings are connected to a gate driver circuit or a source driver circuit, respectively. Further, in the case of a liquid crystal display element, color filters each having the same size as of the liquid crystal display element are provided on the surface of the liquid crystal display elements and aligned with the liquid crystal display elements such that the liquid crystal display elements are repeatedly arranged corresponding to red (R), green (G) and blue (B) pixel regions (hereinafter, referred to as "RGB") in the long side direction in mentioned order. Thus, it is possible to construct an active matrix type color image display apparatus in A4 size at about 211 ppi.

In addition, also for an EL element including two TFTS, a gate electrode of a first TFT is wired to a gate line, and a source electrode of a second TFT is wired to a signal line, and further, the light emission wavelengths of the EL elements are repeatedly arranged corresponding to RGB in a long side direction in mentioned order. Thereby, it is possible to construct a light emission type color image display apparatus with the same resolution.

Here, the driver circuit for driving an active matrix may be constructed using the TFT of the present invention which is the same as the TFT of a pixel, or an existing IC chip.

The thin-film transistor (TFT) according to the present invention can be applied as a switching element of an LCD or an organic EL display. In addition, it is possible to form a TFT on a flexible material including a plastic film in all the processes at a low temperature, this can be broadly applied to a flexible display, an IC card, an ID tag, and the like.

According to the present invention, it is possible to provide a thin-film transistor having a good interface between an oxide semiconductor layer and an insulating layer.

This application claims priority from Japanese Patent Application No. 2006-074627 filed Mar. 17, 2006, which is hereby incorporated by reference herein.

The invention claimed is:

1. A thin-film transistor comprising, on a substrate:
   a semiconductor layer including a channel region and being electrically connected to a source electrode and a drain electrode;
   a gate insulating film; and
   a gate electrode,
   wherein the semiconductor layer is an amorphous oxide semiconductor layer,
   wherein the gate insulating film is a single layer of amorphous silicon oxynitride, and
   wherein the gate insulating film has an oxygen concentration that varies in a thickness direction, so that the oxygen concentration is relatively high at a side of an interface with the amorphous oxide semiconductor layer, continuously decreases in the thickness direction, and is relatively low at a side of an interface with the gate electrode.

2. The thin-film transistor according to claim 1, wherein the amorphous oxide semiconductor layer includes In, Zn, and O.

3. The thin-film transistor according to claim 2, wherein the amorphous oxide semiconductor layer further includes at least one element selected from a group consisting of Ga, Al, Fe, Sn, Mg, Ca, Si, and Ge, and has a resistance value less than $10^{10}$ Ω·m.

4. A thin-film transistor according to claim 1,
   wherein the thin-film transistor incorporated in a display device that includes a display element, the display element being disposed on the substrate with the thin-film transistor, and
   wherein the source electrode or the drain electrode of the thin-film transistor is connected to an electrode of the display element.

5. The thin-film transistor according to claim 4, wherein the display element is an electroluminescence element.

6. The thin-film transistor according to claim 4, wherein the display element is a liquid crystal cell.

7. The thin-film transistor according to claim 4, wherein a plurality of display elements and a plurality of thin-film transistors are two-dimensionally arranged on the substrate.

8. A thin-film transistor according to claim 2,
   wherein the thin-film transistor incorporated in a display device that includes a display element, the display element being disposed on the substrate with the thin-film transistor, and
   wherein the source electrode or the drain electrode of the thin-film transistor is connected to an electrode of the display element.

9. A thin-film transistor according to claim 3,
   wherein the thin-film transistor incorporated in a display device that includes a display element, the display element being disposed on the substrate with the thin-film transistor, and
   wherein the source electrode or the drain electrode of the thin-film transistor is connected to an electrode of the display element.

10. The thin-film transistor according to claim 8, wherein the display element is an electroluminescence element.

11. The thin-film transistor according to claim 9, wherein the display element is an electroluminescence element.

12. The thin-film transistor according to claim 8, wherein the display element is a liquid crystal cell.

13. The thin-film transistor according to claim 9, wherein the display element is a liquid crystal cell.

14. The thin-film transistor according to claim 5, wherein a plurality of display elements and a plurality of thin-film transistors are two-dimensionally arranged on the substrate.

15. The thin-film transistor according to claim 6, wherein a plurality of display elements and a plurality of thin-film transistors are two-dimensionally arranged on the substrate.

16. The thin film transistor according to claim 1, wherein the amorphous oxide semiconductor layer is an amorphous In—Ga—Zn oxide semiconductor layer.

17. The thin film transistor according to claim 16, wherein the amorphous In—Ga—Zn oxide semiconductor layer further includes at least one element selected from a group consisting of Al, Fe, Sn, Mg, Ca, Si and Ge, and has a resistance value less than $10^{10}$ Ω·m.

18. A thin-film transistor comprising, on a substrate:
a semiconductor layer including a channel region and being electrically connected to a source electrode and a drain electrode;
a gate insulating film; and
a gate electrode,
wherein the semiconductor layer is an amorphous oxide semiconductor layer,
wherein the gate insulating film is a single layer of amorphous silicon oxynitride,
wherein the gate insulating film has an oxygen concentration that varies in a thickness direction, so that the oxygen concentration is relatively high at a side of an interface with the amorphous oxide semiconductor layer, decreases gradually in the thickness direction, and is relatively low at a side of an interface with the gate electrode, and
wherein the relatively high oxygen concentration of the gate insulating film at the side of the interface with the amorphous oxide semiconductor layer minimizes movement of oxygen through the interface between the gate insulating film and the amorphous oxide semiconductor layer.

19. A thin-film transistor comprising, on a substrate:
a semiconductor layer including a channel region and being electrically connected to a source electrode and a drain electrode;
a gate insulating film; and
a gate electrode,
wherein the semiconductor layer is an amorphous oxide semiconductor layer,
wherein the gate insulating film is a single layer of amorphous silicon oxynitride, and
wherein the gate insulating film has a gradient distribution of an oxygen concentration in a thickness direction, so that the oxygen concentration is relatively high at a side of an interface with the amorphous oxide semiconductor layer, and so that the oxygen concentration continuously decreases toward a side of an interface with the gate electrode.

20. The thin film transistor according to claim 19, wherein the gradient distribution has a constant slope.

21. The thin film transistor according to claim 19, wherein the gradient distribution has a gradually changing slope.

* * * * *